US011901696B2

(12) United States Patent
Zhang et al.

(10) Patent No.: US 11,901,696 B2
(45) Date of Patent: Feb. 13, 2024

(54) WAVELENGTH DRIFT SUPPRESSION FOR BURST-MODE TUNABLE EML LASER

(71) Applicant: Google LLC, Mountain View, CA (US)

(72) Inventors: Tao Zhang, Mountain View, CA (US); Cedric Fung Lam, San Carlos, CA (US); Shuang Yin, Sunnyvale, CA (US); Xiangjun Zhao, Fremont, CA (US); Liang Du, Santa Clara, CA (US); Changhong Joy Jiang, Dublin, CA (US); Adam Edwin Taylor Barratt, Portland, OR (US); Claudio Desanti, Mountain View, CA (US); Muthu Nagarajan, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 628 days.

(21) Appl. No.: 17/057,645

(22) PCT Filed: May 7, 2019

(86) PCT No.: PCT/US2019/031051
§ 371 (c)(1),
(2) Date: Nov. 21, 2020

(87) PCT Pub. No.: WO2019/226333
PCT Pub. Date: Nov. 28, 2019

(65) Prior Publication Data
US 2021/0151952 A1   May 20, 2021

Related U.S. Application Data

(60) Provisional application No. 62/674,447, filed on May 21, 2018.

(51) Int. Cl.
*H01S 5/024* (2006.01)
*H01S 5/026* (2006.01)
(Continued)

(52) U.S. Cl.
CPC .......... *H01S 5/0428* (2013.01); *H01S 5/0265* (2013.01); *H01S 5/06255* (2013.01);
(Continued)

(58) Field of Classification Search
CPC .................. H01S 5/06255; H01S 5/06253
See application file for complete search history.

(56) References Cited

U.S. PATENT DOCUMENTS

| 2001/0005388 | A1 | 6/2001 | Hirata et al. |
| 2019/0124426 | A1* | 4/2019 | Mazed ............... H04Q 11/0067 |
| 2020/0296489 | A1* | 9/2020 | Mazed ............... H04Q 11/0005 |

OTHER PUBLICATIONS

Zhao Hang et al: "Chirp-Compensated DBR Lasers for TWDM-PON Applications", IEEE Photonics Journal, IEEE, USA, vol. 7, No. 1, Feb. 1, 2015 (Feb. 1, 2015), pp. 1-9, XP011573345, DOI: 10.1109/JPHOT.2015.2392377 [retrieved on Feb. 12, 2015].

(Continued)

*Primary Examiner* — Tuan N Nguyen
(74) *Attorney, Agent, or Firm* — Honigman LLP; Brett A. Krueger

(57) ABSTRACT

A method (700) of biasing a tunable laser (310) during burst-on and burst-off states includes receiving a burst mode signal (514) indicative of the burst-on state or the burst-off state and when the burst mode signal is indicative of the burst-on state: delivering a first bias current ($I_{GAIN}$) to an anode of a gain-section diode (590a) disposed on a shared substrate of the tunable laser; and delivering a second bias current ($I_{PH}$) to an anode of phase-section diode (590b) disposed on the shared substrate. The second bias current is less than the first bias current. When the burst mode signal transitions to be indicative of the burst-off state, the method also includes delivering the first bias current to the anode of the gain-section diode; and delivering the second bias current to the anode of the phase-section diode wherein the first bias current is less than the second bias current.

20 Claims, 11 Drawing Sheets

(51) Int. Cl.
  *H01S 5/042* (2006.01)
  *H01S 5/0625* (2006.01)
  *H04B 10/50* (2013.01)
  *H04B 10/54* (2013.01)
  *H04B 10/564* (2013.01)
  *H04B 10/27* (2013.01)

(52) U.S. Cl.
  CPC ......... *H04B 10/504* (2013.01); *H04B 10/541* (2013.01); *H04B 10/564* (2013.01); *H01S 5/02453* (2013.01); *H04B 10/27* (2013.01)

(56) References Cited

OTHER PUBLICATIONS

Xu J J et al: "EAM modulated DBR laser array for TWDM-PON applications", 2016 IEEE Photonics Conference (IPC), IEEE, Oct. 2, 2016 (Oct. 2, 2016), pp. 1-2, XP033050723, DOI: 10.1109/IPCON.2016.7831051 [retrieved on Jan. 23, 2017].
Bhagwan Das et al: "Energy Efficient Design of Hyper Transport Protocol based Laser Driver using Low-Voltage Differential Signaling", International Journal of Control and Automation, vol. 8, No. 9, Sep. 30, 2015 (Sep. 30, 2015), pp. 131-138, XP55609554, KR ISSN: 2005-4297, DOI: 10.14257/ijca.2015.8.9.13.
Zhang Tao: "Tunable Laser Drivers for Next Generation WDM-Based PON Networks", 2019 Optical Fiber Communications Conference and Exhibition (OFC), OSA, Mar. 3, 2019 (Mar. 3, 2019), pp. 1-3, XP033540483, [retrieved on Apr. 22, 2019].
International Search Report for the related application No. PCT/US2019/031051, dated Aug. 7, 2019, 89 pages.

* cited by examiner

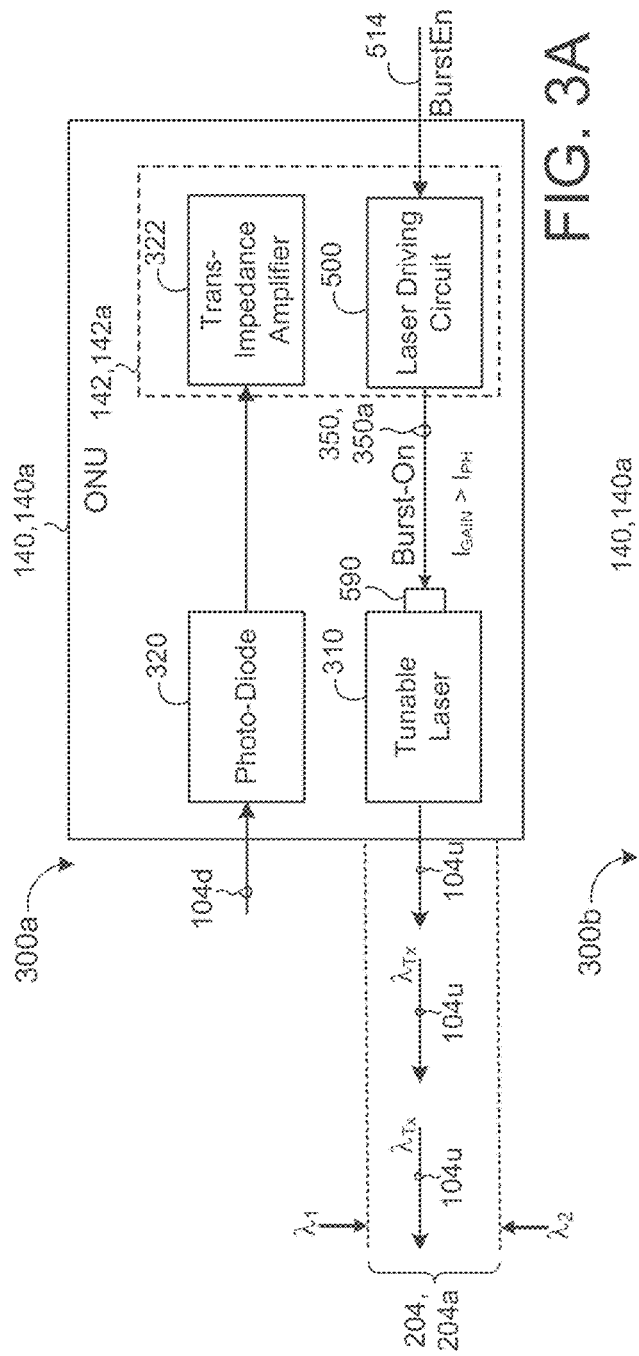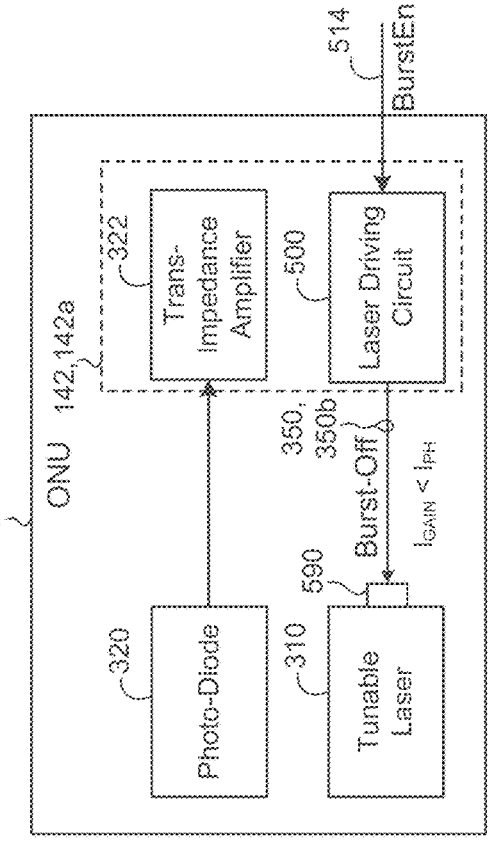

WAVELENGTH DRIFT SUPPRESSION FOR BURST-MODE TUNABLE EML LASER

TECHNICAL FIELD

This disclosure relates to wavelength drift suppression for burst-mode tunable EML transmitters.

BACKGROUND

The tunable optical network unit (ONU) is a component widely used in a Time and Wavelength Division Multiplexing Passive Optical Network (TWDM-PON) system, which serves as the primary architecture for Next-Generation Passive Optical Networks (NG-PON1 and NG-PON2). A tunable transmitter, which is made of a laser and a driving circuit for the laser, is the most critical component in the tunable ONU. Traditionally, Directly Modulated Lasers (DMLs) have been widely used in the TWDM-PON system with wavelength lengths tuned either through Distributed Bragg Reflector (DBR) current or the temperature by Thermoelectric Cooling (TEC) control. However, DML-based tunable ONUs suffer from limited transmission distance because of dispersion. Instead, an Electro-absorption Modulated Laser (EML)-based tunable ONU is preferable because of its superior performance and compact size. Typically, a burst-mode circuit drives an EML. Wavelength stability is a crucial specification for a tunable ONU and the associated burst-mode circuit, as wavelength drift may cause channel cross-talk. Temperature can have a significant impact on the wavelength of the laser. Despite the TEC controlling the temperature accurately at static states, the self-heating effects, introduced by burst-operations, can cause large wavelength drifts, which eventually introduces large Bit-Error-Rate (BER) for the optical system. Moreover, a fast burst time is required to reduce the overhead and increase the bandwidth of the system.

SUMMARY

One aspect of the disclosure provides a method of biasing a tunable laser during burst-on and burst-off slates includes receiving, at a laser driving circuit, a burst mode signal indicative of the burst-on state or the burst-off state, and when the burst mode signal is indicative of the burst-on state: delivering, by the laser driving circuit, a first bias current to an anode of a gain-section diode disposed on a shared substrate of the tunable laser, and delivering, by the laser driving circuit, a second bias current to an anode of a phase-section diode disposed on the shared substrate of the tunable laser. The second bias current is less than the first bias current. When the burst mode signal transitions to be indicative of the burst-off state from the burst on state, the method also includes: delivering, by the laser driving circuit, the first bias current to the anode of the gain-section diode; and delivering, by the laser driving circuit, the second bias current to the anode of the phase-section diode, wherein the first bias current is less than the second bias current.

Implementations of the disclosure may include one or more of the following optional features. In some implementations, the first bias current is equal to a tail current minus the second bias current and the second bias current is equal to the tail current minus the first bias current. Additionally or alternatively, the tunable laser may include an Electro-absorption (EA) modulated tunable laser In some examples, the method further includes receiving, at the laser driving circuit, a tail current adjustment from a burst control stage of the laser driving circuit. Here, the tail current adjustment is configured to adjust a tail current. The tail current adjustment may be connected to a voltage source or to a power management integrated circuit. In some implementations, the burst control stage includes a differential pair of first and second MOSFETs each connected to a burst mode signal source, wherein the first MOSFET connected to the anode of the gain-section diode and the second MOSFET is connected to the anode of the phase-section diode. In these implementations, the first MOSFET may be turned off and the second MOSFET may be turned on when the burst mode signal is indicative of the burst-off state, while the first MOSFET may be turned on and the second MOSFET may be turned off when the burst mode signal is indicative of the burst-on state In some implementations, the method further includes modulating, by the laser driving circuit, the laser by a capacitively coupled modulation stage of the laser driving circuit to an anode of an Electro-Absorption-section diode, resulting in an alternating current (AC) modulation current. In these implementations, the capacitively coupled modulation stage may include a differential pair of first and second MOSFETs. the first MOSFET connected to a positive data signal source and to a first resistor, the first resistor connected to a voltage source, the second MOSFET connected to a negative data signal source, a second resistor, and a capacitor, the second resistor connected to the voltage source, and the capacitor connected to the anode of the Electro-Absorption-section diode. Additionally, the capacitor may be connected to an inductor connected to a variable voltage source.

Another aspect of the disclosure provides a laser driving circuit that includes a tail current source configured to: deliver a first bias current to an anode of a gain-section diode disposed on a shared substrate of a tunable laser; and deliver a second bias current to an anode of a phase-section diode disposed on the shared substrate of the tunable laser. The laser driving circuit also includes a burst control stage configured to receive a burst mode signal indicative of a burst-on state or a burst0off state The burst control stage is configured to, when the burst mode signal is indicative of the burst-off state, deliver the first bias current to the anode of the gain-section diode and deliver the second bias current to the anode of the phase-section diode, wherein the first bias current is less than the second bias current. The burst control stage is also configured to, when the burst mode signal is indicative of the burst-on state, deliver the first bias current to the anode of the gain-section diode and deliver the second bias current to the anode of the phase-section diode, wherein the first bias current is greater than the second bias current.

This aspect may include one or more of the following optional features. In some implementations, the first bias current is equal to a tail current minus the second bias current and the second bias current is equal to the tail current minus the first bias current. Additionally or alternatively, the tunable laser may include an Electro-absorption (EA) Modulated tunable laser.

In some examples, the laser driving circuit further includes a tail current adjustment configured to adjust a tail current. The tail current adjustment may be connected to a voltage source or to a power management integrated circuit. In some implementations, the laser driving circuit further includes a differential pair of first and second MOSFETs each connected to a burst mode signal source, wherein the first MOSFET connected to the anode of the gain-section diode and the second MOSFET is connected to the anode of the phase-section diode. In these implementations, the first MOSFET may be turned off and the second MOSFET may be turned on when the burst mode signal is indicative of the burst-off state, while the first MOSFET may be turned on and the second MOSFET may be turned off when the burst mode signal is indicative of the burst-on state.

In some implementations, the laser driving circuit further includes a modulating stage capacitively coupled to an anode of an Electro-Absorption-section diode, resulting in an alternating current (AC) modulation current. In these implementations, the capacitively coupled modulation stage may include a differential pair of first and second MOSFETs, the first MOSFET connected to a positive data signal source and to a first resistor, the first resistor connected to a voltage source, the second MOSFET connected to a negative data signal source, a second resistor, and a capacitor, the second resistor connected to the voltage source, and the capacitor connected to the anode of the Electro-Absorption-section diode. Additionally, the capacitor may be connected to an inductor connected to a variable voltage source.

The details of one or more implementations of the disclosure are set forth in the accompanying drawings and the description below. Other aspects, features, and advantages will be apparent from the description and drawings, and from the claims.

DESCRIPTION OF DRAWINGS

FIGS. 3A and 3B are schematic views of an optical network unit configured to suppress wavelength drift when switching between operation in a burst-on state and a burst-off state.

Like reference symbols in the various drawings indicate like elements

DETAILED DESCRIPTION

Implementations herein are directed toward an Electro-absorption Modulated Laser (EML) driving circuit configured to suppress wavelength drift caused by burst operation of EMLs used in tunable optical network units (ONUs).

Figure 1:
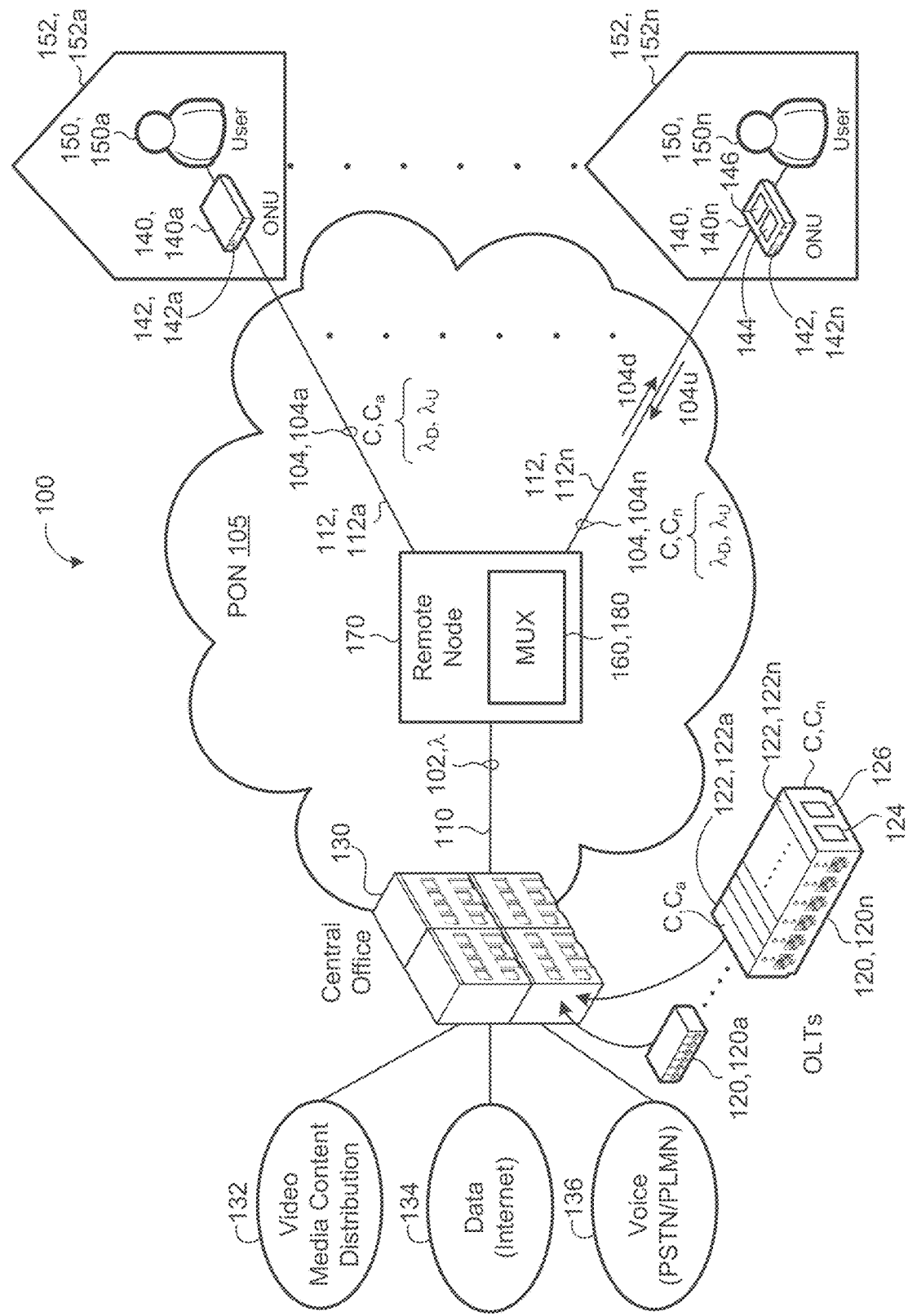
FIG. 1 is a schematic view of an example communication system.

Referring to FIG. 1, an optical communication system 100 delivers communication signals 102 (e.g., optical signals) through communication links 110, 112, 112a-n (e.g., optical fibers or line-of-sight free space optical communications) between an optical line terminal (OLT) 120 housed in a central office (CO) 130 and optical network units (ONUs) 140, 140a-n (e.g., a bidirectional optical transceiver) associated with users 150, 150a-n (also referred to as customers or subscribers). The ONUs 140, 140a-n are typically located at premises 152, 152a-n of the users 150, 150a-n Customer premises equipment (CPE) is any terminal and associated equipment located at the premises 152 of the user 150 and connected to a carrier telecommunication channel C at a demarcation point ("demarc") In the examples shown, the ONU 140 is a CPE. The demarc is a point established in a house, building, or complex to separate customer equipment from service provider equipment. CPE generally refers to devices such as telephones, routers, switches, residential gateways (RG), set-top boxes, fixed mobile convergence products, home networking adapters, or Internet access gateways that enable the user 150 to access services of a communications service provider and distribute them around the premises 152 of the user 150 via a local area network (LAN).

In some implementations, the optical communication system 100 implements an optical access network 105, such as a passive optical network (PON) 105, for example, for access and mobile fronthaul/backhaul networks. In some examples, the optical communication system 100 implements a point-to-point (pt-2-pt) PON having direct connections, such as optical Ethernets, where a home-run optical link 110, 112 (e.g., fiber) extends all the way back to an OLT 120 at the CO 130 and each customer 150, 150a-n is terminated by a separate OLT 120a-n. In other examples, the optical communication system 100 implements a point-to-multi-point (pt-2-multi-pt) PON, where a shared OLT 120 services multiple customers 150,150a-n.

The CO 130 includes at least one OLT 120 connecting the optical access network 105 to an Internet Protocol (IP), Asynchronous Transfer Mode (ATM), or Synchronous Optical Networking (SONET) backbone, for example. Therefore, each OLT 120 is an endpoint of the PON 105 and converts between electrical signals used by service provider equipment and optical signals 102 used by the PON 105. Each OLT 120, 120a-n includes at least one transceiver 122,122a-n, depending on the implementation of the optical access network 105. The OLT 120 sends the optical signal 102 via a corresponding transceiver 122, through a feeder fiber 110 to a remote node (RN) 170. which includes a band-multiplexer 160 configured to demultiplex the optical signal 102 and distribute demulitplexed optical signals 104 to multiple users 150, 150a-n along corresponding distribution fibers 112, 112a-n. The band-multiplexer 160 for multiplexing/demultiplexing may be an arrayed wavelength grating 180 (AWG), which is a passive optical device. In some examples, each CO 130 includes multiple OLTs 120. 120a-n, and each OLT 120 is configured to service a group of users 150. In addition, each OLT 120 may be configured to provide signals in different services, e.g., one OLT 120 may provide services in 1G-PON, while another OLT 120 provides services in 10G-PON.

As shown in FIG. 1, the CO 130 multiplexes signals received from several sources, such as a video media distribution source 132, an Internet data source 134, and a voice data source 136, and multiplexes the received signals into one multiplexed signal 102 before sending the multiplexed optical signal 102 to the RN 170 through the feeder fiber 10. The multiplexing may be performed by the OLT 120 or a broadband network gateway (BNG) positioned at the CO 130. Typically, services are time-division-multiplexed on the packet layer.

Time-division-multiplexing (TDM) is a method of transmitting and receiving independent signals over a common signal path by using different, non-overlapping time slots. Wavelength division multiplexing (WDM) uses multiple wavelengths λ to implement point-to-multi-point communications in the PON 105. The OLT 120 serves multiple wavelengths through one fiber 110 to the band-multiplexer 160 at the RN 170, which multiplexes/demultiplexes signals between the OLT 120 and a plurality of ONUs 140, 140a-n. Multiplexing combines several input signals and outputs a combined signal Time wavelength division multiplexing (TWDM) uses both time and wavelength dimensions to multiplex signals.

For WDM and dense-WDM (DWDM), the OLT 120 includes multiple optical transceivers 122, 122a-n Each optical transceiver 122 transmits signals at one fixed wavelength $\lambda_D$ (referred to as a downstream wavelength) and receives optical signals 102 at one fixed wavelength $\lambda_U$ (referred to as an upstream wavelength). The downstream and upstream wavelengths $\lambda_D$, $\lambda_U$ may be the same or different. Moreover, a channel C may define a pair of downstream and upstream wavelengths $\lambda_D$, $\lambda_U$, and each optical transceiver 122, 122-n of a corresponding OLT 120 may be assigned a unique channel $C_{a-n}$.

The OLT 120 multiplexes/demultiplexes the channels C, $C_{a-n}$ of its optical transceivers 122, 122a-n for communication of an optical signal 102 through the feeder fiber 110. Whereas, the band-multiplexer 160 at the RN 170 multiplexes/demultiplexes optical signals 102, 104, 104-n between the OLT 120 and a plurality of ON Us 140, 140a-n. For example, for downstream communications, the band-multiplexer 160 demultiplexes the optical signal 102 from the OLT 120 into ONU optical signals 104, 104a-n, i.e., downstream optical signals 104d, for each corresponding ONU 140, 140a-n. For upstream communications, the band-multiplexer 160 multiplexes ONU optical signals 104, 104a-n from each corresponding ONU 140, 140a-n, i.e., upstream optical signals 104u, into the optical signal 102 for delivery to the OLT 120. To make the transmission successful, the optical transceivers 122, 122a-n of the OLT 120 match with the ONUs 140, 140a-n one-by-one. In other words, the downstream and upstream wavelengths $\lambda_D$, $\lambda_U$ (i.e., the channel C) of respective downstream and upstream optical signals 104d, 104u to and from a given ONU 140 matches the downstream and upstream wavelengths $\lambda_D$, $\lambda_U$ (i.e., the channel C) of a corresponding optical transceiver 122

In some implementations, each ONU 140, 140a-n includes a corresponding tunable ONU transceiver 142, 142a-n (e.g., that includes a laser or light emitting diode) that can tune to any wavelength λ used by a corresponding OLT 120 at a receiving end. The ONU 140 may automatically tune the tunable ONU transceiver 142 to a wavelength λ that establishes a communication link between the corresponding OLT 120 and the ONU 140. Each optical transceiver 122, 142 may include data processing hardware 124, 144 (e.g., control hardware, circuitry, field programmable gate arrays (FPGAs, etc ) and memory hardware 126, 146 in communication with the data processing hardware 124, 144. The memory hardware 126, 146 may store instructions (e.g., via firmware) that when executed on the data processing hardware 124, 144 cause the data processing hardware 124, 144 to perform operations for auto-tuning the optical transceiver 122, 142. In some configurations, the tunable ONU transceiver 142 includes a laser driving circuit 500a-b (FIGS. 5A and 5B) configured to continuously provide a current to a tunable laser 310 in a burst-on state (FIG. 3A) and a burst-off state (FIG. 3B). The ONU 140 may include a photodetector that converts the optical wave to an electrical form. The electrical signal may be further de-multiplexed down to subcomponents (e.g., data over a network, sound waves converted into currents using microphones and back to its original physical form using speakers, converting images converted into currents using video cameras and converting back to its physical form using a television). Additional details on auto-tuning the ONU 140 to communicate with the corresponding OLT 120 can be found in U.S. patent application Ser. No. 15/354,811, tiled on Nov. 17, 2016, which is hereby incorporated by reference in its entirety.

Figure 2:
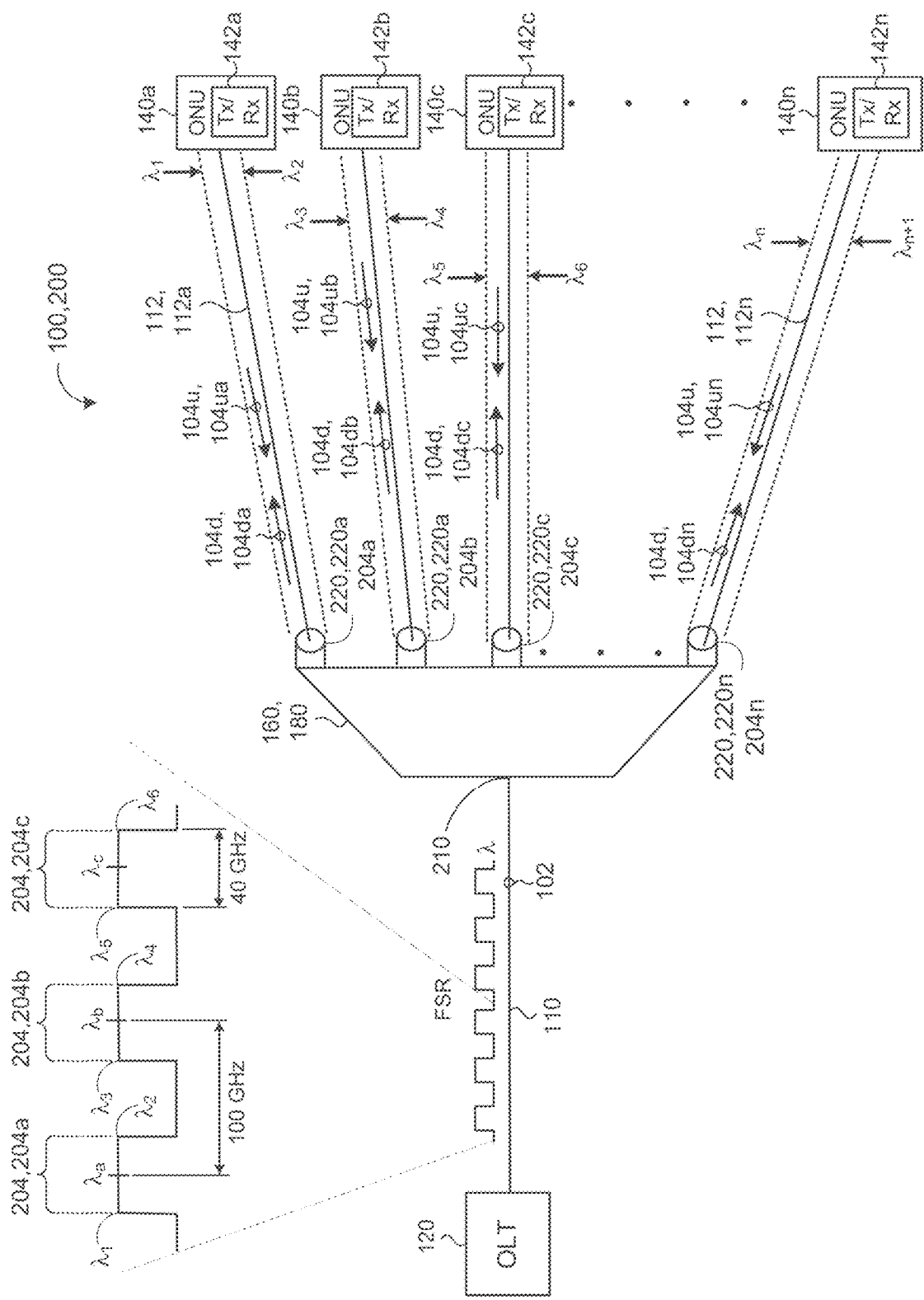
FIG. 2 is a schematic view of an example dense-wavelength division multiplexing architecture for a communication system.

FIG. 2 illustrates an example DWDM architecture 200 for the communication system 100 that facilitates user aggregation onto a single strand of fiber 110, 112, 112a-n An exemplary arrayed waveguide grating 180 (AWG), which may be used as a band-multiplexer 160, is optically coupled to the OLT 120 and a plurality of ONUs 140, 140a-n. The AWG 180 may be used to demultiplex an optical signal 102 through the feeder fiber 110 from the OLT 120 into downstream ONU optical signals 104d, 104da-104dn of several different wavelengths A for each corresponding ONU 140, 140a-n. The AWG 180 may reciprocally multiplex upstream ONU optical signals 104u, 104ua-104un of different wavelengths λ from each ONU 140 into a single optical feeder fiber 110, whereby the OLT 120 receives the multiplexed optical signal 104 through the feeder fiber 110. The AWG 180 includes a multiplex port 210 optically coupled to the OLT 120 and a plurality of demultiplex ports 220, 220a-n Each demultiplex port 220 is optically coupled to a corresponding ONU 140 of the plurality of ONUs 140, 140a-n. In some examples, the AWG 180 is disposed at the RN 170. In other examples, the AWG 180 is disposed OLT 120, or more specifically, co-located with the OLT 120 at the CO 130.

The AWG 180 is cyclic in nature The wavelength multiplexing and demultiplexing property of the AWG 180 repeats over periods of wavelengths called free spectral range (FSR). Multiple wavelengths, separated by the FSR, are passed through the AWG 180 from each demultiplex port 220 to the multiplex port 210. In the example shown, each of the multiple wavelengths λ of the FSR are separated by about 100 Gigahertz (GHz) with a wavelength pass-band 204 of about 40 GHz. For instance, first, second, and third wavelengths $\lambda_a$, $\lambda_b$, $\lambda_c$ are each separated by 100 GHz and associated with a corresponding wavelength pass-band 204, 204a-c of about 40 GHz However, in other configurations, the wavelength pass-band 204 may be greater than or equal to 40 GHz. The wavelength pass-band 204a associated with wavelength $\lambda_a$ is defined by lower and upper wavelength limits $\lambda_1$, $\lambda_2$, the wavelength pass-band 204b associated with wavelength $\lambda_b$ is defined by upper and lower wavelength limits $\lambda_3$, $\lambda_4$, and the wavelength pass-band 204c associated with wavelength $\lambda_c$ is defined by upper and lower wavelength limits $\lambda_5$, $\lambda_6$. The wavelength pass-bands 204 may be separated by a range of wavelengths associated with a stop-band. In the example shown, a stop-band is defined between the upper wavelength limit $\lambda_2$ of the wavelength pass-band 204a and the lower wavelength limit $\lambda_3$ of the wavelength pass-band 204b, and another stop-band is defined between the upper wavelength limit $\lambda_4$ of the wavelength pass-band 204b and the lower wavelength limit $\lambda_5$ of the wavelength pass-band 204c.

In some implementations, each demultiplex port 220, 220a-n of the AWG 180 is associated with a corresponding one of the wavelength pass-bands 204, 204a-n. Here, the AWG 180 is configured to allow passage therethrough of each upstream optical signal 104u having a wavelength within the wavelength pass-band 204 associated with the corresponding demultiplex port 220. However, for any upstream optical signals 104u having a wavelength outside the wavelength pass-band 204 associated with the corresponding demultiplex port 220, the AWG 180 is configured to block the passage therethrough of those upstream optical signals 104u. In the example shown, the ONU transceiver 142a of the ONU 140a transmits a corresponding optical signal 104ua at a wavelength within tire wavelength pass-band 204a of the corresponding demultiplex port 220a. For instance, the wavelength of the optical signal 104ua is greater than the lower wavelength limit $\lambda_1$ and less than the upper wavelength limit $\lambda_2$ of the wavelength pass-band 204a. Similarly, each ONU transceiver 142b-n of the ONUs 140b-n transmits a corresponding optical signal 104ub-104un at a corresponding wavelength within the wavelength pass-band 204b-n associated with the corresponding demultiplex port 220b-n.

Generally, to avoid crosstalk at the OLT 120, only one ONU 140 transmits upstream optical signals 104u to the OLT 120 at a time. The ONU transceivers 142 include a transmitter 310 (FIGS. 3A and 3B), usually a semiconductor laser such as an electro-absorption laser, configured to transmit upstream optical signals 104u to the OLT 120 in a burst-on state. Turning off the laser 310 to cease transmission of the optical signals 104u to the OLT 120 when not in use causes the temperature of the laser 310 to cool. The laser 310 is once again heated when turned on to transmit a subsequent upstream optical signal 104u. The thermal fluctuation caused by the repeated heating and cooling results in wavelength drift each time the laser 310 is turned on. In some examples, the wavelength of the optical signals 104u drift out of the wavelength pass-band 204 associated with the band-multiplexer 160, 180, thereby resulting in the band-multiplexer 160, ISO blocking the passage there through of the optical signals 104u to the OLT 120.

Referring to FIGS. 3A and 3B, in some implementations, the ONU transceiver 142, 142a of the ONU 140, 140a of the communication system 100 includes a laser driving circuit 500 for a tunable laser 310 configured to suppress wavelength drift when switching between operation in a burst-on state (FIG. 3A) and a burst-off state (FIG. 3B). Referring to FIG. 3A, the schematic view 300a shows the ONU 140 tuning the tunable laser 310 while in the burst-on state to transmit the optical signal 104u at the transmit wavelength $\lambda_{Tx}$ within the wavelength pass-band 204, 204a of the band-multiplexer 160 (e.g., AWG 180). The band-multiplexer 160 is configured to allow passage therethrough of the optical signal 104u at the transmit wavelength $\lambda_{Tx}$.

The band-multiplexer 160 may include the AWG 180 having the corresponding demultiplex port 220, 220a associated with the wavelength pass-band 204, 204a defined by the upper and lower wavelength limits $\lambda_1$, $\lambda_2$. The ONU transceiver 142 also includes a trans-impedance amplifier (TIA) 322 configured to receive downstream optical signals 104d through a photo-diode 320 from the OLT 120 that have been demultiplexed by the band-multiplexer 160. The data processing hardware (e.g., control hardware) 144, 144a of the ONU 140 implements an EML driving circuit 500a or 500b with alternating current (AC) coupling that electrically couples electrical signals to the tunable laser 310 to enable last switching between the burst-on and burst-off states and minimize wavelength drifts. For instance, the laser driving circuit 500a-b may deliver a burst-on current 350, 350a to the tunable laser 310 to operate the laser 310 in the burst-on state and may deliver a burst-off current 350, 350b to the tunable laser 310 to operate the tunable laser 310 in the burst-off state. In some configurations, the tunable laser 310 includes a multi-section structure with each section/structure sharing a single substrate For example, the laser 310 may include a tunable electro-absorption modulated laser having a gain section, a phase section, an Electro-Absorption (EA) section, and an optional DBR section on a same substrate Each section has a P-doped Indium phosphide (InP) region on a shared N-doped InP substrate which forms a corresponding diode 590 (gain-section diode 590a, phase-section diode 590b, EA-section diode 590c, and DBR-section diode 590d) with a common cathode. Corresponding injection currents ($I_{D0}$, $I_{D1}$, $I_{D2}$, and $I_{D3}$) drive these diodes 590a-d. The laser 310 is not limited to EML lasers and may correspond to any multi-section tunable laser 310. The gain-section diode 590a is configured to receive a diode current loo (FIGS. 5A and 5B) (e.g., injection current 350, 350a-b) for biasing the laser 310 to a wavelength determined and tuned by the current magnitudes ($I_{DBR}$, $I_{PHASE}$) at the DBR section and the phase section.

In some examples, the laser driving circuit 500 receives a burst mode signal (BurstEn) 514 indicative of the burst-on state to deliver the burst-on current 350a to the tunable laser 310 (i.e., the sum of diode currents the and lot delivered to the anode of the gain-section 590a and the anode of the phase-section diode 590b, respectively) The burst-on current 350a may bias the tunable laser 310 to transmit the optical signal 104u at the transmit wavelength fax within the wavelength pass-band 204 of the band-multiplexer 160. The burst-on current 350a corresponds to a tail current ($I_{DC}$), gain bias current ($I_{GAIN}$ or $I_{D0}$), and phase bias current ($I_{PH}$ or $I_{D1}$), where the tail current $I_{DC}$ is the sum of the gain current $I_{GAIN}$ (across gain-section diode 590a) and phase current $I_{PH}$ (across phase-section diode 590b) and where $I_{GAIN} > I_{PH}$.

Referring to FIG. 3B, the schematic view 300b shows the ONU 140a tuning the tunable laser 310 in the burst-off state to cease transmission of the optical signal 104u to the OLT 120. While in the burst-off state, the laser 310 is not lasing or is only producing an optical power output of low magnitude insufficient for receipt by the receiver sensitivity at the OLT 120. In some implementations, the laser driving circuit 500 receives the burst mode signal (BurstEn) 514 indicative of the burst-off state to deliver the burst-off current 350b to the tunable laser 310 The burst-off current 350b may bias the tunable laser 310 to cease transmission of the optical signal 104u at the transmit wavelength $\lambda_{Tx}$ within the wavelength pass-band 204.

During the burst-off state, the laser driving circuit 500 delivers the burst-off current 350b to the tunable laser 310 to maintain the temperature of the laser 310 during the burst-off state. Here, the burst-off current 350b (i.e., the sum of diode currents $I_{D0}$ and $I_{D1}$ delivered to the anode of the gain-section diode 590a and the anode of the phase-section diode 590b, respectively) corresponds to a gain bias current ($I_{GAIN}$), phase bias current ($I_{PH}$), and a tail current ($I_{DC}$) where, as with the burst-on state, the tail current $I_{DC}$ is the sum of the gain current $I_{GAIN}$ (across gain-section diode 590a) and phase current $I_{PH}$ (across phase-section diode 590b). However, for the burst-off state, $I_{GAIN} < I_{PH}$. Accordingly, the laser 310 is continuously heated by the burst-off current 350b (i.e., primarily $I_{PH}$) during the burst-off state. Thus, rather than un-powering the laser 310 entirely by switching away all of the tail current $I_{DC}$ ($I_{GAIN} + I_{PH}$) or by grounding the anode of the gain-section diode 590a to zero to cease transmission of the optical signal 104u to the OLT 120, and thereby cause cooling of the laser 310, the gain-section diode 590a and phase-section diode 590b are configured to receive the burst-off current 350b to heat the tunable laser 310, while at the same time ceasing transmission of the optical signal 104u to the OLT 120 The continuous heating of the tunable laser 310 by the burst-off current 350$b$ while in the burst-off state decreases thermal fluctuations at the laser 310, and thereby substantially inhibits large wavelength drifts from occurring when the ONU 140 is commanded to subsequently transmit data in the optical signal 104$u$ for receipt by the OLT 120.

Figure 4A:
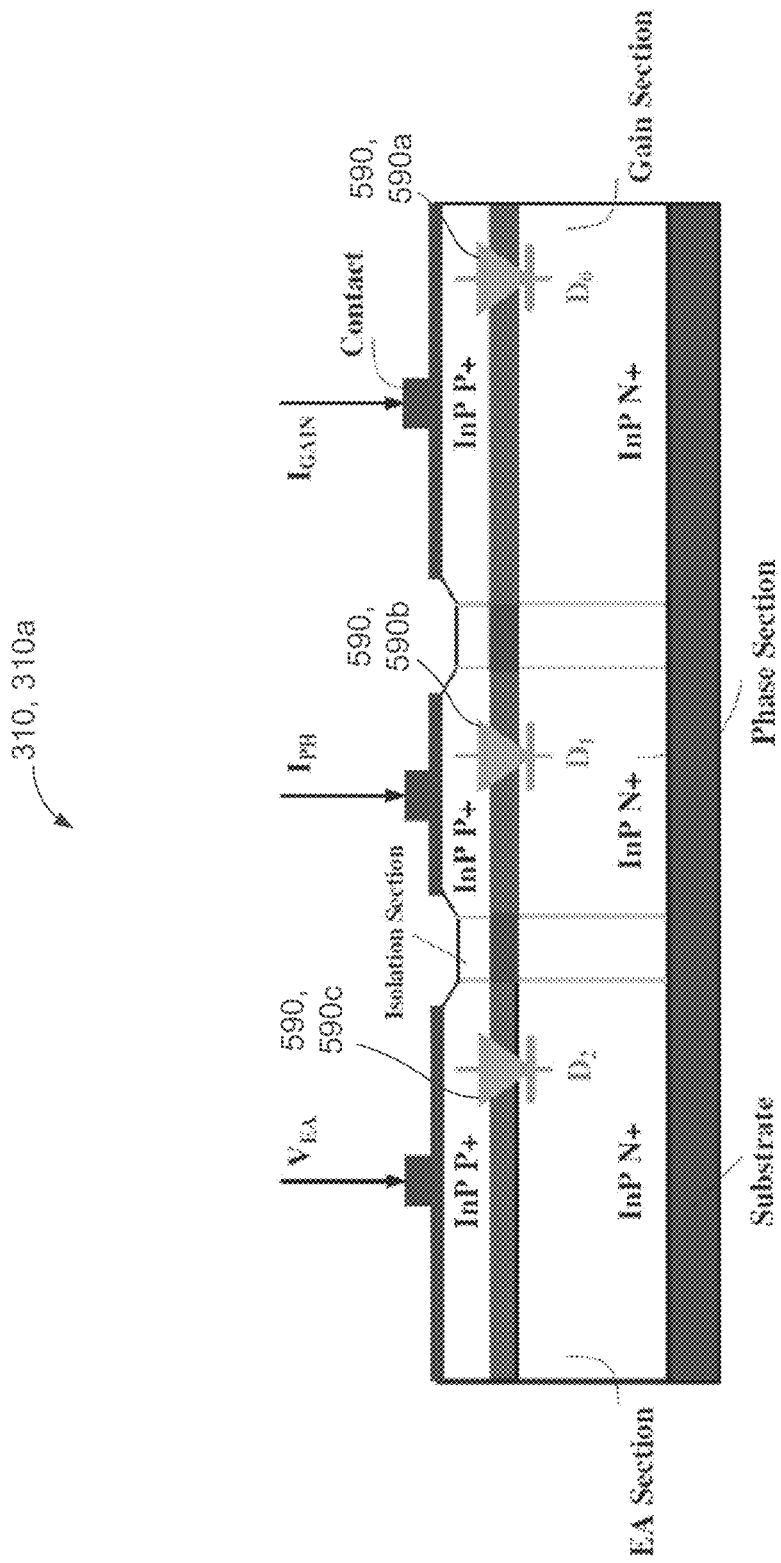
FIGS. 4A-4C are schematic views of example multi-section tunable lasers

FIG. 4A provides an example EML 310$a$ for use in burst mode operations in TWDM-PON applications The laser 310$a$ may include a multi-section structure having a gain section, a phase section, and an Electro-Absorption (EA) section. The Continuous-Wavelength (CW) light emits from the gain-section using the current $I_{GAIN}$. The EA section is reversely-biased by a negative voltage source 552 and works as an optical switch with the modulation voltage. The phase section suppresses the crosstalk between the gain and EA sections. The phase section may also fine-tune the wavelength by using the current $I_{PH}$.

Figure 4B:
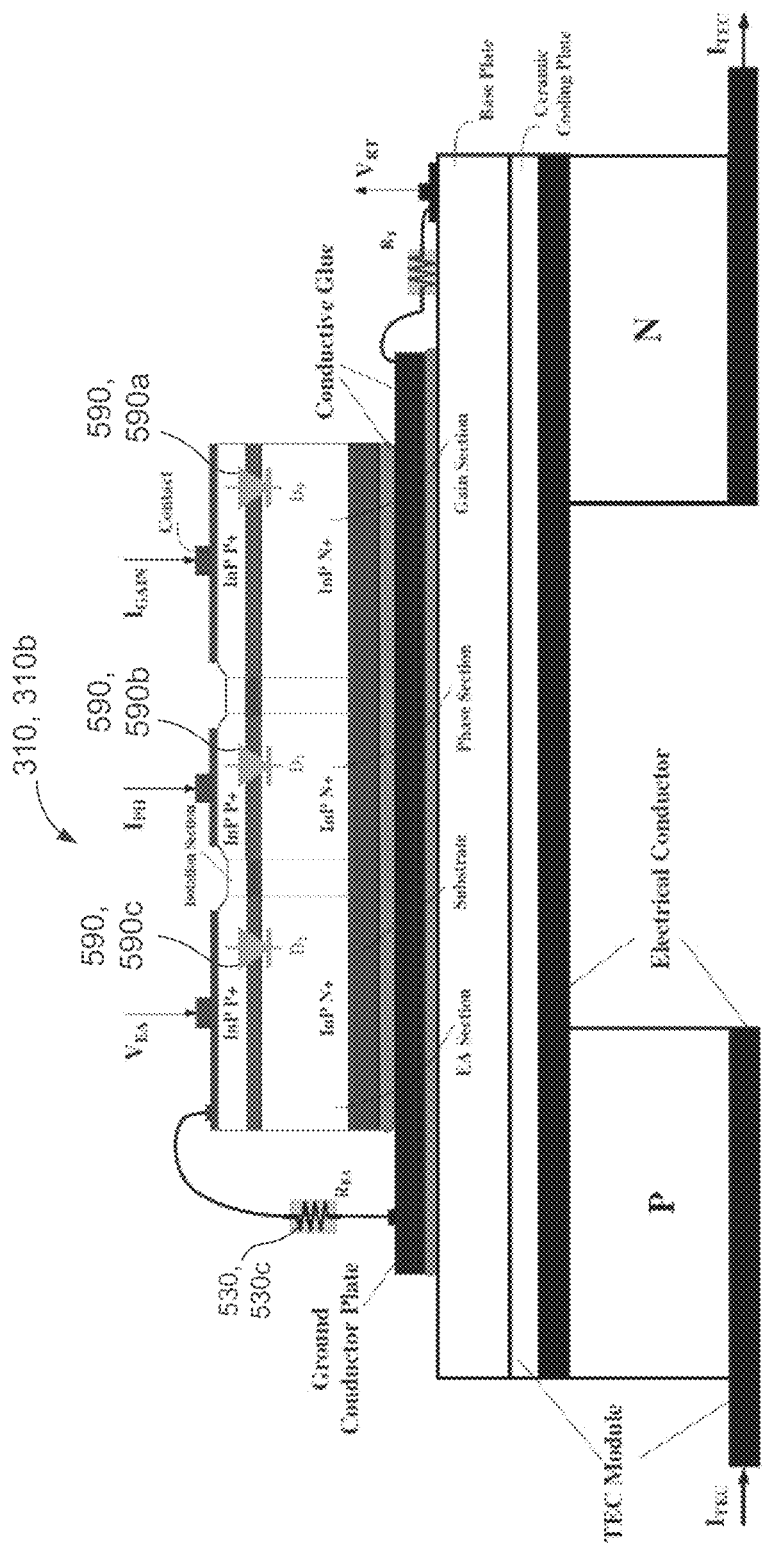

FIG. 4B provides an example EML laser 310$b$ with a wavelength tuning mechanism for the simple EML 310$b$. A Thermoelectric Cooling (TEC) control module precisely controls the temperature of the laser 310$b$ by cooling or warming the laser 310$b$. Because of the correlation between temperature and wavelength, this precise temperature control help tune the wavelength. A thermistor $R_T$, which behaves as a temperature sensor, may attach to the base plate of the EML chip via an adhesive (e.g., conductive glue). The sensed spoilage $V_{RT}$, which indicates the EML chip temperature, feeds the control electronics to tune the TEC current $I_{TEC}$, until the EML chip temperature reaches the target temperature Therefore, the target temperature helps define the wavelength precisely. However, typically TEC control loop response time is measured in seconds, which burst times can be measured in microsecond. Therefore, regional thermal variations around the laser waveguide introduce wavelength drifts even with use of a TEC. Termination resistor $R_{EA}$ 530$c$ is bonded in the EA section for impedance matching purpose during high-speed modulation.

Figure 4C:
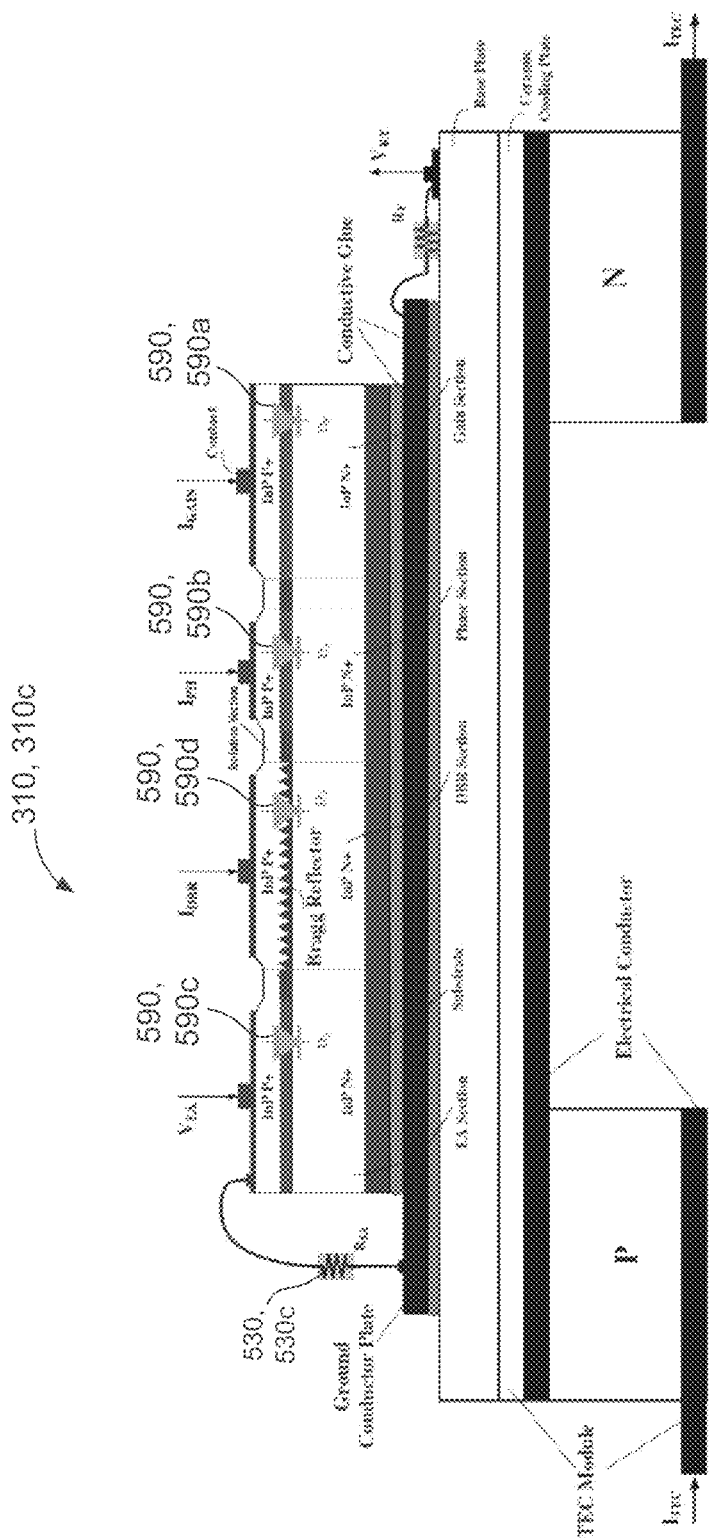

A Distributed Bragg Reflector (DBR) tuning mechanism, in some implementations, tunes the wavelength in addition to the TEC. This allows for further extending of tuning range. As shown in FIG. 4C, an example EML 310$c$ has an additional DBR section. The wavelength is tuned by the refractive index change of the injection current $I_{DBR}$. The TEC may then further fine-tune the wavelength.

The gain sections of the lasers 310 generate suitable optical power for achieving the transmission distance of the optical signal 104$u$ to the OLT 120. The driving circuit 500 provides these functions through implementation of the biasing current and the modulation current, denoted as $I_{GAIN}$ and $I_{MOD}$ in the example shown. The biasing current generates output power and the modulation current adds the information to the carrier wavelength.

Figure 5A:
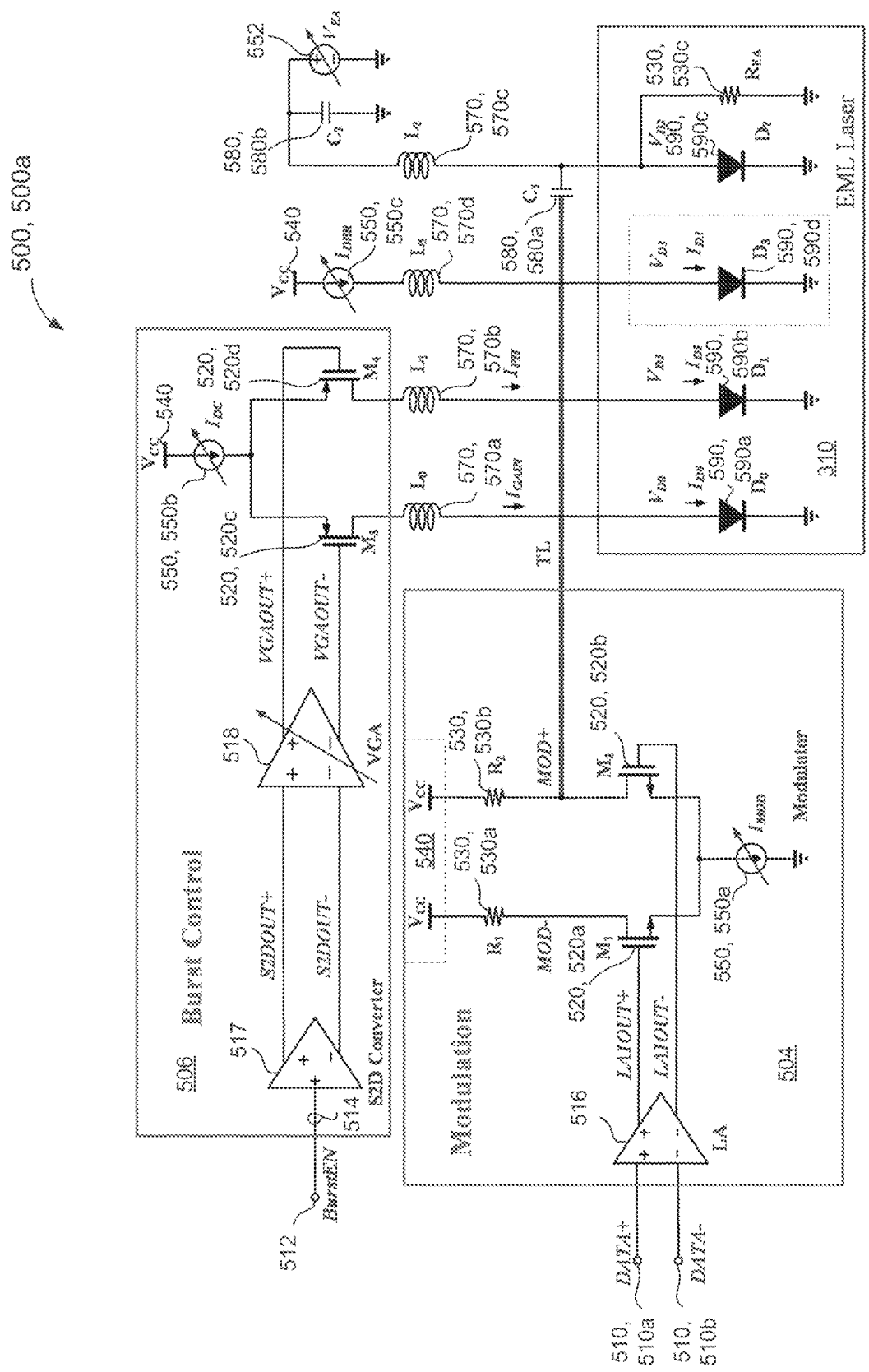
FIG. 5A-5B are schematic views of example Electro-absorption Modulated Laser (EML) driving circuits for use in a tunable optical network unit (ONU).
Figure 5B:
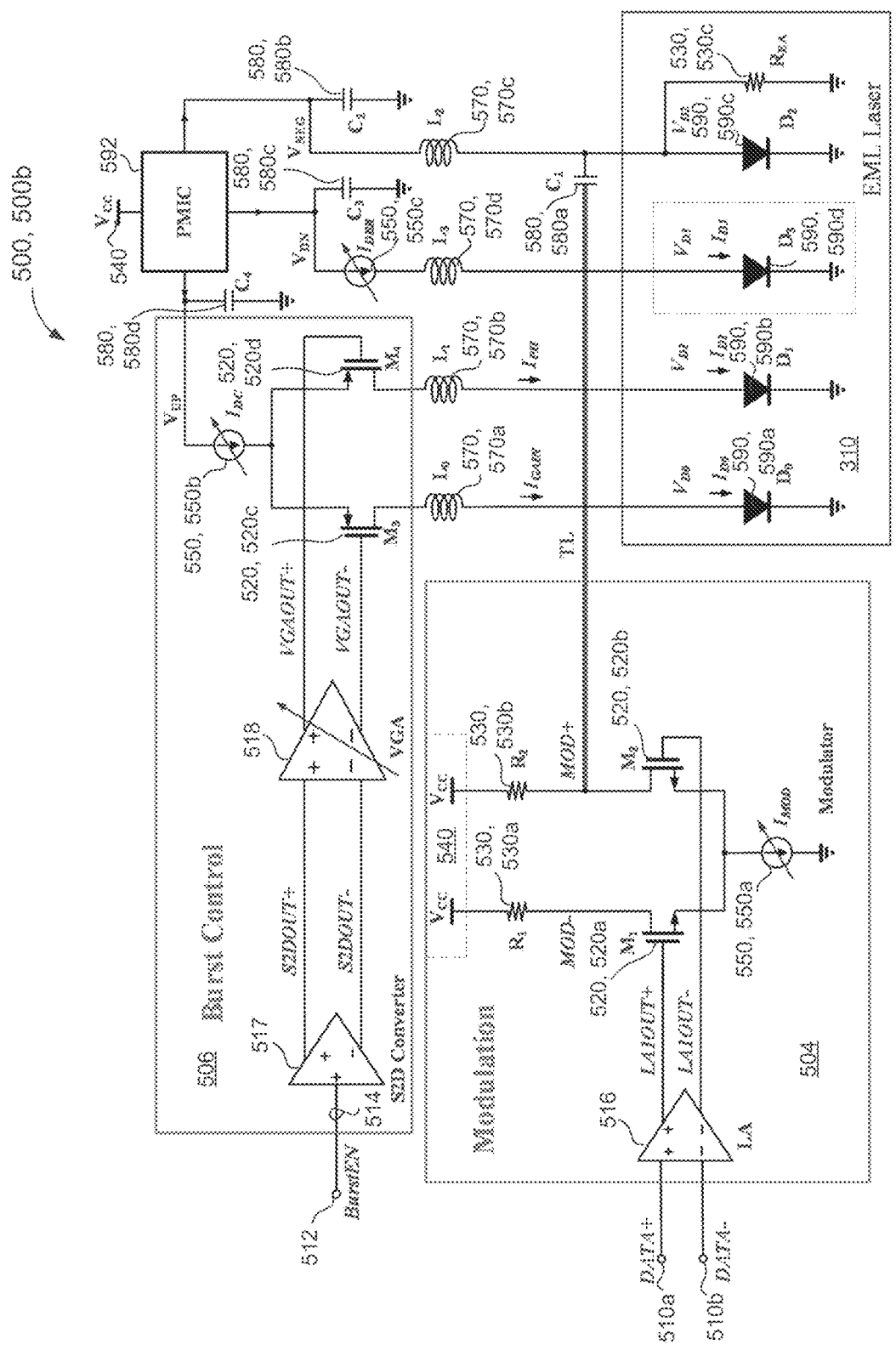

In the example shown of FIG. 4C, each section has P doping anodes (InP P+) with N doping (InP N+) shared-substrate as the cathode, which is normally grounded during the application The diodes (590$a$-$d$) for the DBR tunable laser 310 all share the same cathode for circuit behaviors. While low-speed programmable digital to analog converters (DACs) can provide $I_{DBR}$ and $I_{PHASE}$, the laser driving circuits 500, 500$a$-$b$ of FIGS. 5A and 5B are used for providing $I_{GAIN}$ through an EML topology with the capability to provide both the biasing current and the high-speed modulation current. The TWDM-PON requires the laser 310 to have stable wavelength and fast ON_OFF times during burst operations. Typically, the phase sections of an EML (see FIGS. 4A-4C.) fine-tunes the wavelength through manipulation of $I_{PH}$ and otherwise grounded if not used. However, as described in more detail below, the phase section also compensates for temperature variations during burst operations to reduce wavelength drift and increase burst operations. Reducing the wavelength drift and speeding up burst operations with an improved laser driving circuit design, rather than optical technology improvement, provides reduced costs.

FIGS. 5A and 5B provide schematic views of two example EML driving circuits 500, 500$a$ (FIG. 5A) and 500, 500$b$ (FIG. 5B) for use in a tunable ONU 140. The circuits 500$a$-$b$ are configured to deliver the gain-section diode current $I_{D0}$ to the anode of the gain-section diode 590$a$ and the phase-section diode current $I_{D1}$ to the anode of the phase-section diode 590$b$ disposed on the shared substrate of the multi-section tunable laser 310.

A modulation stage 504 of circuits 500 includes a limiting amplifier (LA) 516 and transistors 520$a$ and 520$b$. The limiting amplifier 516 receives input data signals DATA+, DATA− providing data information from a data signal source 510 and amplifies the input data signals DATA+, DATA−. In the example shown, the LA 516 corresponds to a differential-in differential-out limiting amplifier for amplifying the differential input data signals DATA+, DATA− from the data signal source 510. The amplified DATA+, DATA− signals switch transistors 520$a$ and 520$b$ in the modulation stage 504. The inputs of the amplifier 516 may include terminating resistors to avoid signal reflection.

The modulation stage 504 adds an electrical modulation signal to the EA-section diode 590$c$. Differential pair transistors 520$a$ and 520$b$ are connected to current source ($I_{MOD}$) 550,550$a$, and resistors 530, 530$a$-$b$. The current source 550$a$ is programmable and may be implemented by a current DAC to control a modulation magnitude. The EA-section diode 590$c$. part of the EML 310, is reversely-biased by a programmable voltage source 552. To avoid affecting the normal operating point with the reverse-biasing voltage, an AC capacitor 580, 580$a$ couples the modulation to the EA-section diode 590$c$ anode. Resistor 530$b$, optimally located near voltage supply 540, is matched (e.g., has the same value) with resistor 530$c$ to increase speed and signal integrity. Likewise, resistor 530$a$ is also a termination resistor. The connection to the far-end capacitor 580$a$ functions as a high-speed transmission line (TL1) with characteristic impedance equal to resistor 530$c$. Inductor 570, 570$c$ shields diode 590$c$ from the negative voltage source 552 effects during high-speed modulation. Capacitor 580$b$ filters low-frequency ripples from the programmable voltage source 552.

A burst control stage 506 of circuits 500 includes a single to double (S2D) converter 517, an amplifier, for example a variable gain amplifier (VGA) 518, transistors, such as metal-oxide-semiconductor field-effect transistors (MOSFETs) 520, 520$c$-$d$, and a tail current source 550$b$. In some implementations, the circuits 500$a$-$b$ use Bipolar Junction Transistors (BJTs) instead of the MOSFETs 520 to perform switching operations.

The S2D converter 517 receives single-ended input signal BurstEN 514 from burst mode signal source 512, and converts BurstEN 514 into differential signals S2DOUT+ and S2DOUT−. The S2D converter 517 is configured to accommodate large input swing range while maintaining a fixed output swing magnitude. BurstEN 514 indicates to the laser circuit 500$a$-$b$ a burst-on or a burst-off state. For example, a logic high or '1' may indicate a burst-on state while a logic low or '0' may indicate a burst-off state The VGA 518 receives and amplifies the differential S2DOUT signals based on a programmed gain variable. The amplified differential S2DOUT signals VGAOUT+ and VGAOUT− connect to differential MOSFET pair 520d and 520c respectively. The differential pair 520c-d connect to the anodes of the gain-section diode 590a and the phase-section diode 590b. For instance, transistor 520c connects to the anode of the gain-section diode 590a and transistor 520d connects to the anode of the phase-section diode 590b. The BurstEN signal 514 switches transistors 520c-d in the burst control stage 506. The differential pair 520c-d also connect to current source 550b, which delivers variable tail current $I_{DC}$. Current source 550b connects to voltage source 540. Current $I_{DC}$, delivered by tail current source 550b, is divided between the differential pair 520c-d Thus, current $I_{DC}$ is the sum of the gain-section diode 590a current ($I_{GAIN}$) and the phase-section diode 590b current ($I_{PH}$).

A cathode of the gain-section diode 590a and phase-section diode 590b are grounded. The anodes of the gain-section diode 590a and phase-section diode 590b may connect to MOSFET differential pair 520c-d through inductors and/or ferrite beads (e.g., 570a and 570b) to shield the diodes 590a-b from parasitic currents from the current source 550b. The magnitude of $I_{GAIN}$ delivered to the diode 590a determines the optical power of the laser 310 for transmitting optical signals 104u at the at the transmit wavelength $\lambda_{Tx}$ within the wavelength pass-band 204 in the burst-on state. The magnitude of $I_{PH}$ delivered to the diode 590b determines, in part, the wavelength $\lambda_{Tx}$.

At burst-on state (BurstEN 514 is asserted), by setting the gain of the VGA 518 to a large magnitude, the differential outputs VGAOUT+ and VGAOUT− are amplified large enough to completely switch the following PMOS differential pair 520. Specifically, VGAOUT+ switches off transistor 520d, while VGAOUT− switches transistor 520c on completely In this state, all current will pass through transistor 520c ($I_{GAIN}$) and no current will flow through transistor 520d ($I_{PH}$). Setting the gain of the VGA 518 to a lower value can make the PMOS differential pair 520 partially turn ON and OFF, therefore, the ratio of current divided between the two transistors 520c-d is determined by the gain setting of the VGA 518 (e.g., the voltage swing between VGAOUT+ and VGAOUT−). The programmability of the VGA gain gives the flexibility to tune the burst time. The CW laser diode 590a is biased by the current $I_{GAIN}$, and $I_{GAIN}$ defines the optical power accordingly When the burst mode transitions to the burst-off state (BurstEN 514 is not asserted), VGAOUT+ switches on 520d, while VGAOUT− switches transistor 520c off. In this state, less current will pass through transistor 520c ($I_{GAIN}$) than current that will flow through transistor 520d ($I_{PH}$). This biases the current $I_{GAIN}$ at a level that is below the optical power necessary for the laser 310 to operate normally. However, the total current ($I_{GAIN}+I_{PH}$) delivered to the laser 310 is the same regardless of the state of BurstEN 514. Therefore, driving circuits 500a-b remove the current variations caused by self-heating effects during bursts and reduce wavelength drift. Optionally, a current DAC implements current $I_{DC}$ 550b.

In some implementations, as shown in FIG. 5B, programmable current $I_{DC}$ 550b is connected to power management integrated circuit (PMIC) 592 This may further improve the power management by accommodating additional headroom for the PMOS differential pair 520c and 520d. PMOS devices have differing threshold voltages and often require large headroom. As an alternative to power source $V_{cc}$540, the PMIC 592 provides a regulated voltage to supply the tail current $I_{DC}$ 550b. This supplies a boosted voltage to transistors 520c-d, which allows for large headroom. Further, such a regulated voltage helps suppress the current inaccuracies caused by noises or ripples from $V_{cc}$540. To this end, the PMIC 592 may also replace variable voltage source 552 and supply $I_{DBR}$ 550c.

Thus, circuits 500 use differential transistors 520c-d to swap DC current between the gain-section diode 500a and phase-section diode 590b during burst operations As a result, the total current injected to the EML 310 remains constant for both burst-on and burst-off states. Therefore, wavelength drift (from temperature variation) caused by current self-healing effects is minimized. Further, the circuits 500 control precisely the difference between $I_{GAIN}$ and $I_{PH}$ during burst operations to assist meeting strict system requirements.

In traditional driving circuits, during the burst-off state, $I_{GAIN}$ is completely switched away from the diode 590a, so that $I_{D0}$, as well as $V_{D0}$, is at or near 0. Then, the output optical power of the laser 310 is negligible. However, fully disabling the laser 310 creates a long burst-on time as the 590a anode must re-stabilize from 0V to the voltage above the threshold, which is normally greater than IV. Similarly, this also creates a long burst-off time. Moreover, fully disabling the laser 310 introduces additional wavelength drift because of the large ON-OFF laser current difference. Instead of completely diverting current from the laser 310 at burst-off state, the laser circuit 500a-b may program $I_{SINK}$ such that the laser current $I_{D0}$ is slightly below a threshold required to operate the laser 310 at an optical power required for transmission. While such an optical power is effective for a burst-off state, the laser 310 can quickly return to the burst-on state, allowing for faster modulation than if the circuit 500a-b fully diverts the current away from the laser 310.

Figure 6:
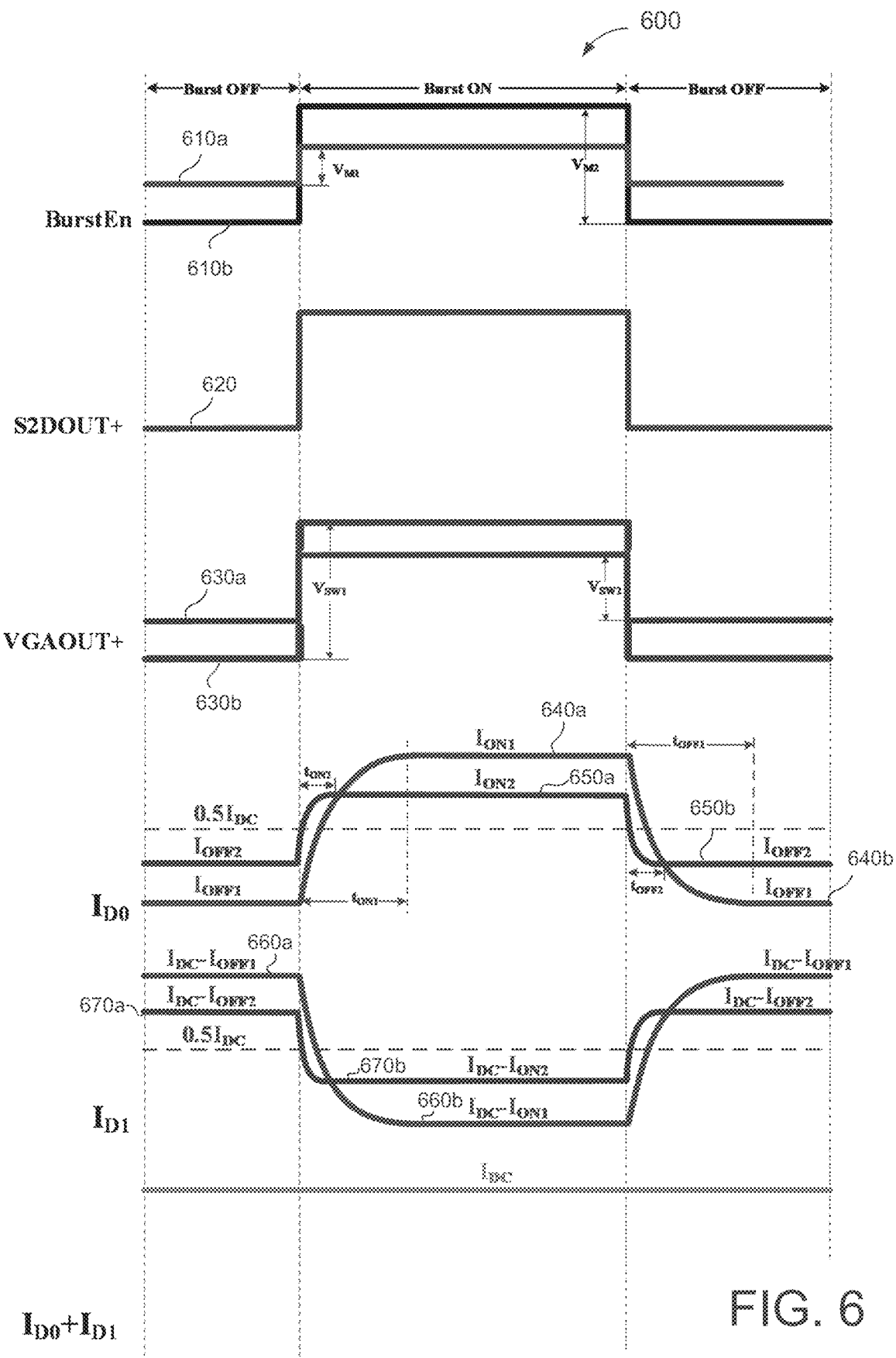
FIG. 6 illustrates a plot depicting burst-on state and burst-off state times and currents applied by the laser driving circuits of FIG. 5A or 5B.

Referring now to FIG. 6, BurstEn 514 often has a wide input swing ($V_{M1}$ to $V_{M2}$). Profile line 610a depicts BurstEn 514 with input swing $V_{M1}$ while profile line 610b depicts BurstEn 514 with input sing $V_{M2}$. The S2D converter 517 converts the single-ended input BurstEn signal 514 to outputs S2DOUT+ and S2DOUT− where the S2D converter 517 fixes an output swing after conversion, regardless of an input swing (e.g., if the swing is $V_{M1}$ or $V_{M2}$). For example, profile line 620 depicts S2DOUT+ for either BurstEn 514 with $V_{M1}$ or $V_{M2}$. Still referring to FIG. 5, following the S2D converter 517, the VGA 518 accepts S2DOUT+ and S2DOUT− from the S2D converter 517. The VGA 518 has different output swings, depending on its gain setting For example, if the gain (A)=0, then the output swing is 0. Further, if $A_1>A_2$, then at the output of the VGA 518, $V_{SW1}>V_{SW2}$. The output swing introduces the source gate voltage difference ($\Delta V_{SG}$) for 520c-d, and therefore, the difference in currents across the devices 520c-d. For example, when the VGA 518 gain=0, $\Delta V_{SG}$=0, therefore current $I_{DC}$ will be split evenly into $I_{GAIN}$ and $I_{PH}$.

At burst-on state, the $V_{SG}$ of transistor 520c is larger than the $V_{SG}$ of transistor 520d. Hence, more current flows across transistor 520c than transistor 520d. Therefore, $I_{D0}$ is larger than $I_{D1}$. On the other hand, at the burst-off state, $I_{D1}$ is larger than $I_{D0}$. However, the sum of $I_{D0}$ and $I_{D1}$ is constantly equal to $I_{DC}$, regardless of the burst state, so the circuits 500 avoid the wavelength drift introduced by self-heating effects. Still referring to FIG. 6. profile line 630a depicts the output of VGA 518 with gain=$A_1$ ($V_{SW1}$) while profile line 630b depicts the output of VGA 518 with gain=$A_2$ ($V_{SW2}$) As gain increases, the output swing of VGA 518 increases.

The VGA 518 provides the circuit 500 flexibility in controlling burst time by programming the VGA 518 output swing. The current difference across the gain-section diode 590a and the phase-section diode 590b depends upon the VGA output swing magnitude. If $V_{SW1} > V_{SW2}$, then $I_{ON1}$ (640a)–$I_{OFF1}$ (640b) > $I_{ON2}$ (650a)–$I_{OFF2}$ (650b). Similarly, ($I_{DC}$-$I_{OFF1}$) (660a)–($I_{DC}$-$I_{ON1}$) (660b) > ($I_{DC}$-$I_{OFF2}$) (670a)–($I_{DC}$-$I_{ON2}$) (670b). Moreover, $t_{ON2} < t_{ON1}$ and $t_{OFF2} < t_{OFF1}$. This allows circuit 500 to easily tune the burst time.

Figure 7:
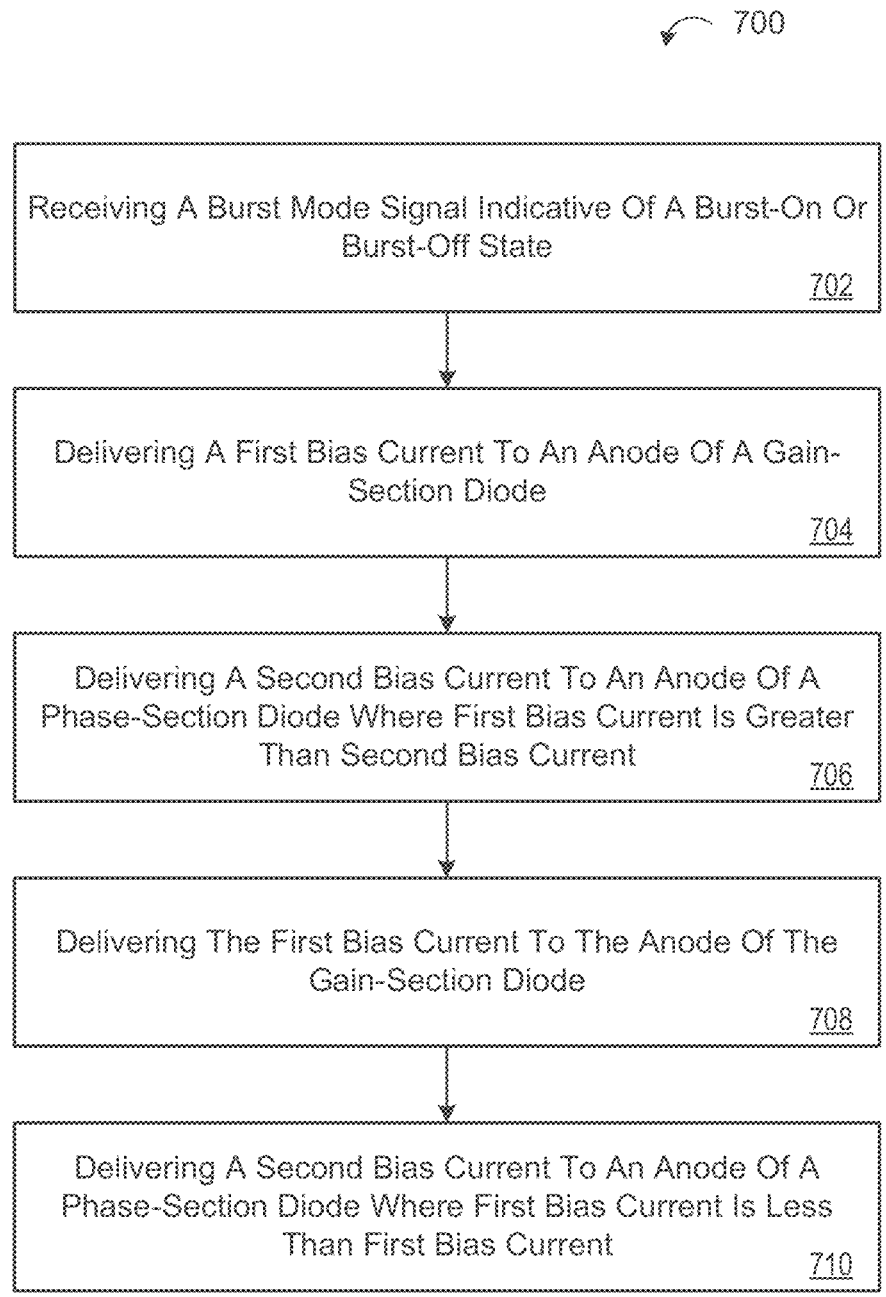
FIG. 7 is a schematic view of an example arrangement of operations for a method of biasing a tunable laser during burst-on and burst-off states through an EML driving circuit

FIG. 7 is a flowchart of an example method 700 for biasing a tunable laser 310 during burst-on and burst-off states through an EML driving circuit 500. For example, the tunable laser 310 may be an electro-absorption modulated tunable laser The flowchart starts at operation 702 when the laser driving circuit 500a-b receives a burst mode signal indicative of a burst-on state or a burst-off state.

At operation 704, when the burst mode signal is indicative of the burst-on state, the method 700 includes delivering, by the laser driving circuit 500, a first bias current to an anode of a gain-section diode 590a on a shared substrate of a tunable laser. The method 700, at operation 706, includes delivering, by the laser driving circuit 500, a second bias current to an anode of a phase-section diode 590b where the first bias current is greater than the second bias current. The first bias current is equal to a tail current minus the second bias current while the second bias current is equal to the tail current minus the first bias current.

At operation 708, when the burst mode signal transitions to be indicative of the burst-off state from the burst-on state, the method 700 includes delivering, by the laser driving circuit 500, where the first bias current to the anode of the gain-section diode 590a. The method 700, at operation 710, includes delivering, by the laser driving circuit 500, the second bias current to the anode of the phase-section diode 590b, where the first bias current is less than the second bias current.

In some examples, the method 700 includes receiving, at the laser driving circuit 500, a tail current adjustment 550b from a burst control stage 506 of the laser driving circuit 500. The tail current adjustment 550b is configured to adjust the tail current. Optionally, the tail current adjustment 550b connects to a voltage source 540. Alternatively, the tail current adjustment 550b connects to a power management integrated circuit 592. In some implementations, the burst control stage 506 includes a differential pair of first and second MOSFETs 520c and 520d, each MOSFET connected to a burst mode signal source 512, the first MOSFET 520c connected to the anode of the gain-section diode 590a, the second MOSFET 520d connected to the anode of the phase-section diode 590b. When the burst mode is indicative of the burst-off state, the first MOSFET 520c is turned off and the second MOSFET 520d is turned on. Similarly, when the burst mode is indicative of the burst-on state, the first MOSFET 520c is turned on and the second MOSFET 520d is turned off.

In some implementations, the method 700 includes modulating, by the laser driving circuit 500, the laser 310 by a capacitively coupled modulation stage 504 of the laser driving circuit 500 to the anode of an EA-section diode 590c, resulting in an alternating current (AC) modulation current. The modulation stage 504 may include a differential pair of first and second MOSFETs 520a and 520b, the first MOSFET 520a connected to a positive data signal source 510a and to a first resistor 530a, the first resistor 530a connected to a voltage source 540, the second MOSFET 520b connected to a negative data signal source 510b, a second resistor 530b, and a capacitor 580a, the second resistor 530b connected to the voltage source 540, and the capacitor 580a connected to the anode of the EA-section diode 590c The capacitor 580a may be connected to an inductor 570c connected to a variable voltage source 552.

Figure 8:
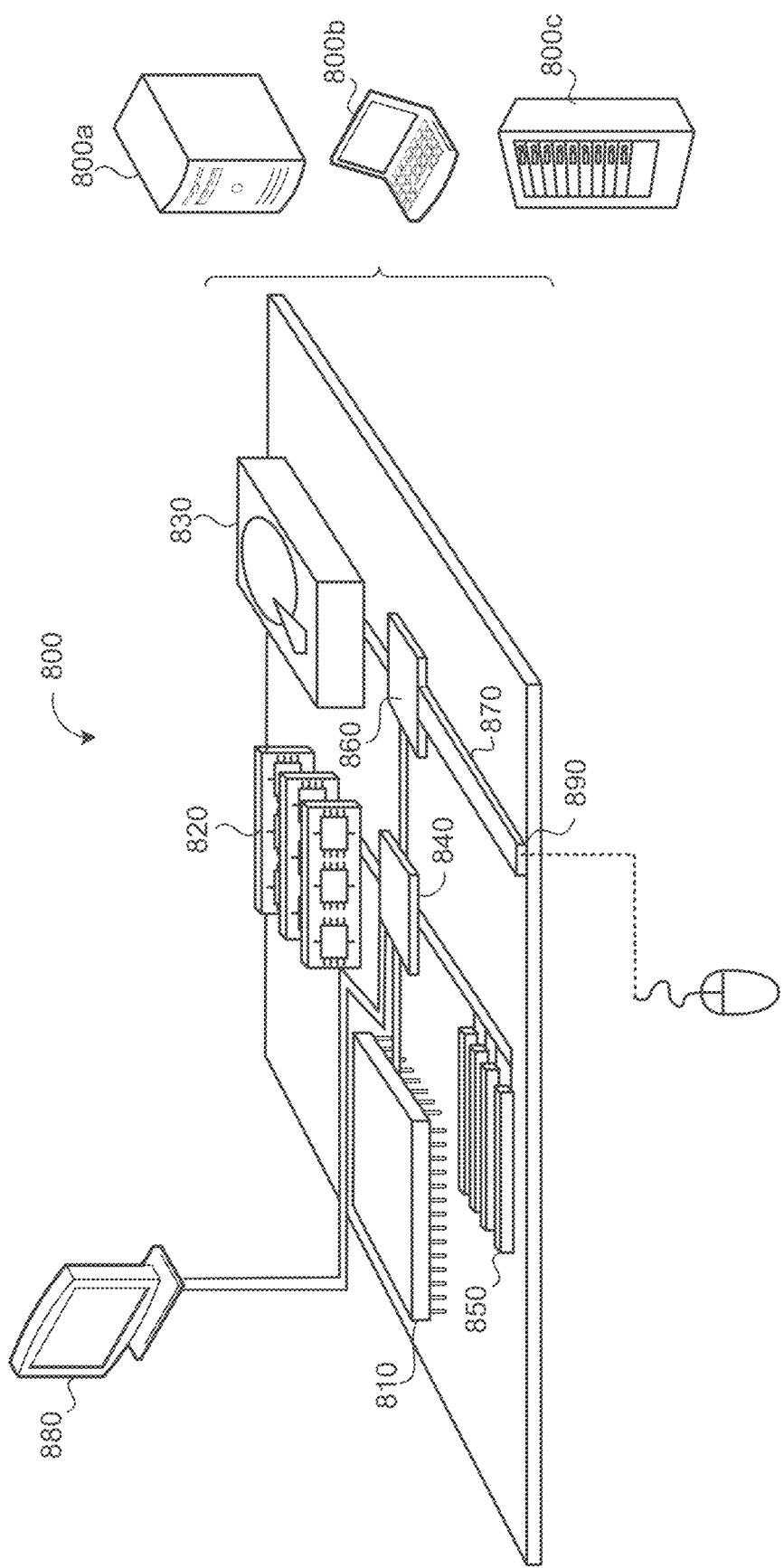
FIG. 8 is a schematic view of an example computing device that may be used to implement the systems and methods described in this document.

FIG. 8 is schematic view of an example computing device 800 that may be used to implement the systems and methods described in this document. The computing device 800 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 800 includes a processor 810, memory 820, a storage device 830, a high-speed interface/controller 840 connecting to the memory 820 and high-speed expansion ports 850, and a low speed interface/controller 860 connecting to a low speed bus 870 and a storage device 830 Each of the components 810, 820, 830, 840, 850, and 860, are interconnected using various busses, and may be mounted on a common motherboard or in other manners as appropriate. The processor 810 can process instructions for execution within the computing device 800, including instructions stored in the memory 820 or on the storage device 830 to display graphical information for a graphical user interface (GUI) on an external input/output device, such as display 880 coupled to high speed interface 840. In other implementations, multiple processors and/or multiple buses may be used, as appropriate, along with multiple memories and types of memory. Also, multiple computing devices 800 may be connected, with each device providing portions of the necessary operations (e.g. as a server bank, a group of blade servers, or a multi-processor system).

The memory 820 stores information non-transitorily within the computing device 800. The memory 820 may be a computer-readable medium, a volatile memory unit(s), or non-volatile memory unit(s). The non-transitory memory 820 may be physical devices used to store programs (e.g., sequences of instructions) or data (e.g., program state information) on a temporary or permanent basis for use by the computing device 800. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 830 is capable of providing mass storage for the computing device 800. In some implementations, the storage device 830 is a computer-readable medium. In various different implementations, the storage device 830 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 820, the storage device 830, or memory on processor 810.

The high speed controller 840 manages bandwidth-intensive operations for the computing device 800, while the low speed controller 860 manages lower bandwidth-intensive operations. Such allocation of duties is exemplary only In some implementations, the high-speed controller 840 is coupled to the memory 820, the display 880 (e.g., through a graphics processor or accelerator), and to the high-speed expansion ports 850, which may accept various expansion cards (not shown). In some implementations, the low-speed controller 860 is coupled to the storage device 830 and a low-speed expansion port 890. The low-speed expansion port 890, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 800a or multiple times in a group of such servers 800a, as a laptop computer 800b, or as part of a rack server system 800c.

A software application (i.e., a software resource) may refer to computer software that causes a computing device to perform a task. In some examples, a software application may be referred to as an "application," an "app," or a "program." Example applications include, but are not limited to, system diagnostic applications, system management applications, system maintenance applications, word processing applications, spreadsheet applications, messaging applications, media streaming applications, social networking applications, and gaming applications.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

The processes and logic flows described in this specification can be performed by one or more programmable processors, also referred to as data processing hardware, executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices, magnetic disks, e.g., internal hard disks or removable disks, magneto optical disks, and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well, for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A method comprising:
  receiving, at a laser driving circuit, a burst mode signal indicative of a burst-on state or a burst-off state;
  when the burst mode signal is indicative of the burst-on state:
    delivering, by the laser driving circuit, a first bias current to an anode of a gain-section diode disposed on a shared substrate of a tunable laser, the tunable laser comprising an Electro-absorption Modulated tunable laser; and
    delivering, by the laser driving circuit, a second bias current to an anode of a phase-section diode disposed on the shared substrate of the tunable laser, wherein the second bias current is less than the first bias current; and
  when the burst mode signal transitions to be indicative of the burst-off state from the burst-on state:

delivering, by the laser driving circuit, the first bias current to the anode of the gain-section diode; and delivering, by the laser driving circuit, the second bias current to the anode of the phase-section diode, wherein the first bias current is less than the second bias current, wherein:
the first bias current is equal to a tail current minus the second bias current; and
the second bias current is equal to the tail current minus the first bias current.

2. The method of claim 1, further comprising receiving, at the laser driving circuit, a tail current adjustment from a burst control stage of the laser driving circuit, the tail current adjustment configured to adjust a tail current.

3. The method of claim 2, wherein the tail current adjustment is connected to a voltage source.

4. The method of claim 2, wherein the tail current adjustment is connected to a power management integrated circuit.

5. The method of claim 2, wherein the burst control stage comprises a differential pair of first and second MOSFETs, each MOSFET connected to a burst mode signal source, the first MOSFET connected to the anode of the gain-section diode, the second MOSFET connected to the anode of the phase-section diode.

6. The method of claim 5, wherein the first MOSFET is turned off and the second MOSFET is turned on when the burst mode signal is indicative of the burst-off state.

7. The method of claim 5, wherein the first MOSFET is turned on and the second MOSFET is turned off when the burst mode signal is indicative of the burst-on state.

8. The method of claim 1, further comprising modulating, by the laser driving circuit, the laser by a capacitively coupled modulation stage of the laser driving circuit to an anode of an Electro-Absorption-section diode, resulting in an alternating current modulation current.

9. The method of claim 8, wherein the capacitively coupled modulation stage comprises a differential pair of first and second MOSFETs, the first MOSFET connected to a positive data signal source and to a first resistor, the first resistor connected to a voltage source, the second MOSFET connected to a negative data signal source, a second resistor, and a capacitor, the second resistor connected to the voltage source, and the capacitor connected to the anode of the Electro-Absorption-section diode.

10. The method of claim 9, wherein the capacitor is connected to an inductor connected to a variable voltage source.

11. A laser driving circuit comprising:
a tail current source configured to:
deliver a first bias current to an anode of a gain-section diode disposed on a shared substrate of a tunable laser, the tunable laser comprising an Electro-absorption Modulated tunable laser; and
deliver a second bias current to an anode of a phase-section diode disposed on the shared substrate of the tunable laser;

a burst control stage configured to receive a burst mode signal indicative of a burst-on state or a burst-off state, the burst control stage configured to:
when the burst mode signal is indicative of the burst-off state, deliver the first bias current to the anode of the gain-section diode and deliver the second bias current to the anode of the phase-section diode, wherein the first bias current is less than the second bias current; and
when the burst mode signal is indicative of the burst-on state, deliver the first bias current to the anode of the gain-section diode and deliver the second bias current to the anode of the phase-section diode, wherein the first bias current is greater than the second bias current, wherein:
the first bias current is equal to a tail current minus the second bias current; and
the second bias current is equal to the tail current minus the first bias current.

12. The laser driving circuit of claim 11, further comprising a tail current adjustment configured to adjust a tail current.

13. The laser driving circuit of claim 12, wherein the tail current adjustment is connected to a voltage source.

14. The laser driving circuit of claim 12, wherein the tail current adjustment is connected to a power management integrated circuit.

15. The laser driving circuit of claim 12, further comprising a differential pair of first and second MOSFETs, each MOSFET connected to a burst mode signal source, the first MOSFET connected to the anode of the gain-section diode, the second MOSFET connected to the anode of the phase-section diode.

16. The laser driving circuit of claim 15, wherein the first MOSFET is turned off and the second MOSFET is turned on when the burst mode signal is indicative of the burst-off state.

17. The laser driving circuit of claim 15, wherein the first MOSFET is turned on and the second MOSFET is turned off when the burst mode signal is indicative of the burst-on state.

18. The laser driving circuit of claim 11, further comprising a modulation stage capacitively coupled to an anode of an Electro-Absorption-section diode, resulting in an alternating current modulation current.

19. The laser driving circuit of claim 18, wherein the modulation stage comprises a differential pair of first and second MOSFETs, the first MOSFET connected to a positive data signal source and to a first resistor, the first resistor connected to a voltage source, the second MOSFET connected to a negative data signal source, a second resistor, and a capacitor the second resistor connected to the voltage source and the capacitor connected to the anode of the Electro-Absorption-section diode.

20. The laser driving circuit of claim 19, wherein the capacitor is connected to an inductor connected to a variable voltage source.

* * * * *